(12) United States Patent
Bradford et al.

(10) Patent No.: US 12,089,335 B2
(45) Date of Patent: Sep. 10, 2024

(54) TOUCH DETECTION THROUGH METAL WITH DETAILED LIT ICON

(71) Applicant: Flex Ltd., Singapore (SG)

(72) Inventors: Curtis V. Bradford, Los Gatos, CA (US); Alfredo Garcia, San Jose, CA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 17/522,374

(22) Filed: Nov. 9, 2021

(65) Prior Publication Data

US 2022/0151075 A1    May 12, 2022

Related U.S. Application Data

(60) Provisional application No. 63/111,170, filed on Nov. 9, 2020.

(51) Int. Cl.
*G06F 3/044*    (2006.01)
*H05K 1/18*    (2006.01)

(52) U.S. Cl.
CPC ............ *H05K 1/181* (2013.01); *G06F 3/044* (2013.01); *H05K 2201/09063* (2013.01); *H05K 2201/10106* (2013.01); *H05K 2201/10151* (2013.01)

(58) Field of Classification Search
CPC ......... H05K 1/181; H05K 2201/09063; H05K 2201/10106; H05K 2201/10151; G06F 3/044
See application file for complete search history.

(56) References Cited

U.S. PATENT DOCUMENTS

| | | | | |
|---|---|---|---|---|
| 2009/0140994 A1* | 6/2009 | Tanaka | ............ | H01H 13/83 |
| | | | | 345/173 |
| 2011/0050626 A1* | 3/2011 | Porter | ............ | H03K 17/952 |
| | | | | 345/174 |
| 2011/0280042 A1* | 11/2011 | Pance | ............ | G02B 6/006 |
| | | | | 362/606 |
| 2013/0126325 A1* | 5/2013 | Curtis | ............ | H03K 17/9622 |
| | | | | 200/600 |
| 2020/0142101 A1* | 5/2020 | Shim | ............ | B60R 1/1207 |

FOREIGN PATENT DOCUMENTS

DE    102010033390    2/2012
DE    202011110179    5/2013

OTHER PUBLICATIONS

International Search Report and Written Opinion for International (PCT) Patent Application No. PCT/IB2021/000772, dated Feb. 24, 2022 14 pages.

\* cited by examiner

*Primary Examiner* — Towfiq Elahi
(74) *Attorney, Agent, or Firm* — Sheridan Ross P.C.

(57) ABSTRACT

Embodiments of the present disclosure are directed to a detailed lit indicator and touch detection in the same location through a metal surface. When the light behind the metal is turned off there will be no visible appearance of an indicator. When touched the metal will have no perceptible movement and never experience any deformation or evidence of usage over the life of the product.

14 Claims, 3 Drawing Sheets

TOUCH DETECTION THROUGH METAL WITH DETAILED LIT ICON

CROSS REFERENCE TO RELATED APPLICATION

The present application claims the benefits of and priority, under 35 U.S.C. § 119(e), to U.S. Provisional Application No. 63/111,170 filed Nov. 9, 2020 by Bradford et al and entitled "Touch Detection Through Metal with Detailed Lit Icon" of which the entire disclosure is incorporated herein by reference for all purposes.

FIELD OF THE DISCLOSURE

Embodiments of the present disclosure relate generally to methods and systems for touch sensitive input devices and more particularly to touch detection on a metallic surface having a lit icon.

BACKGROUND

It is desirable for some products to have a clean metallic look with no buttons or other distracting features. A challenge is to have this type of "dead-front" metal design while also providing operational indicators and actuators for the user to operate the device. To provide indicators in such a surface only when desired, it is possible to laser drill very tiny holes through the metal surface which will allow lighting from behind to come through the metal and be visible to the user. These holes are too small to be visible to the naked eye except when light is shining through them from the inside. It is also desirable to provide a mechanism to detect a touch of the metal surface at the same location as such an indicator and to have multiple indicators with touch that are in close proximity to each other. The lighting or touch of one indicator should not affect any other indicators. In the past, products did not offer this touch detection ability in the same location as the lit icon on such a dead-front metallic surface.

BRIEF SUMMARY

Embodiments of the disclosure provide for touch detection on a metallic surface having a lit icon. According to one embodiment, a touch-sensitive input device can comprise a planar base layer having a hole disposed therein. For example, the base layer can comprise a Printed Circuit Board (PCB). A light source can be mounted on a first side of the base layer and can extend into the hole in the base layer. The light source can comprise, for example, a Light Emitting Diode (LED).

A metallic surface layer can be disposed over the base layer on a second side of the base layer opposite the first side of the base layer. The metallic surface layer can comprise a plurality of holes forming an indicator on the surface layer. For example, the indicator can be icon formed from the plurality of holes in the surface layer. The indicator can be visible on a side of the surface layer opposite the base layer when the light source is on and not visible on the side of the surface layer opposite the base layer when the light source is off. In some cases, a diffusion layer can be disposed between the spacer and the surface layer.

A sensor can be disposed between the base layer and the surface layer adjacent to the light source without covering the light source. A spacer layer can be disposed between the base layer and the surface layer. The spacer layer can surround the sensor and the hole in the base layer without covering the light source and can maintain a distance between the base layer and the surface layer and a distance between the surface layer and the sensor. For example, the sensor can comprise a capacitive sensor. In such cases, the distance between the surface layer and the capacitive sensor can be in the range of 0.1 millimeters to 0.3 millimeters. In another example, the sensor can comprise a conductor. In such cases, the distance between the surface layer and the conductor can be approximately 0.1 millimeters. The overall distance between the base layer and the surface layer maintained by the spacer layer can be between 1.2 millimeters and 1.5 millimeters.

According to another embodiment, a Printed Circuit Board (PCB) can comprise a plurality of holes disposed in a surface of the PCB and a plurality of touch-sensitive input devices mounted on the PCB. Each touch-sensitive input device of the plurality of touch-sensitive input devices can comprising a light source mounted on a first side of the PCB and extending into a hole of the plurality of holes in the PCB and a metallic surface layer disposed over the PCB on a second side of the PCB opposite the first side of the PCB. For example, the light source can be a Light Emitting Diode (LED).

The metallic surface layer can comprise a plurality of holes forming an indicator on the surface layer. For example, the indicator can be icon formed from the plurality of holes in the surface layer. The indicator can be visible on a side of the surface layer opposite the base layer when the light source is on and not visible on the side of the surface layer opposite the base layer when the light source is off. In some cases, a diffusion layer can be disposed between the spacer and the surface layer.

A sensor can be disposed between the PCB and the surface layer adjacent to the light source without covering the light source. For example, the sensor can comprise a capacitive sensor. In another example, the sensor can comprise a conductor.

A spacer layer can be disposed between the PCB and the surface layer. The spacer layer can surround the sensor and the hole in the PCB without covering the light source. The spacer layer can maintain a distance between the PCB and the surface layer and a distance between the surface layer and the sensor.

Figure 1:
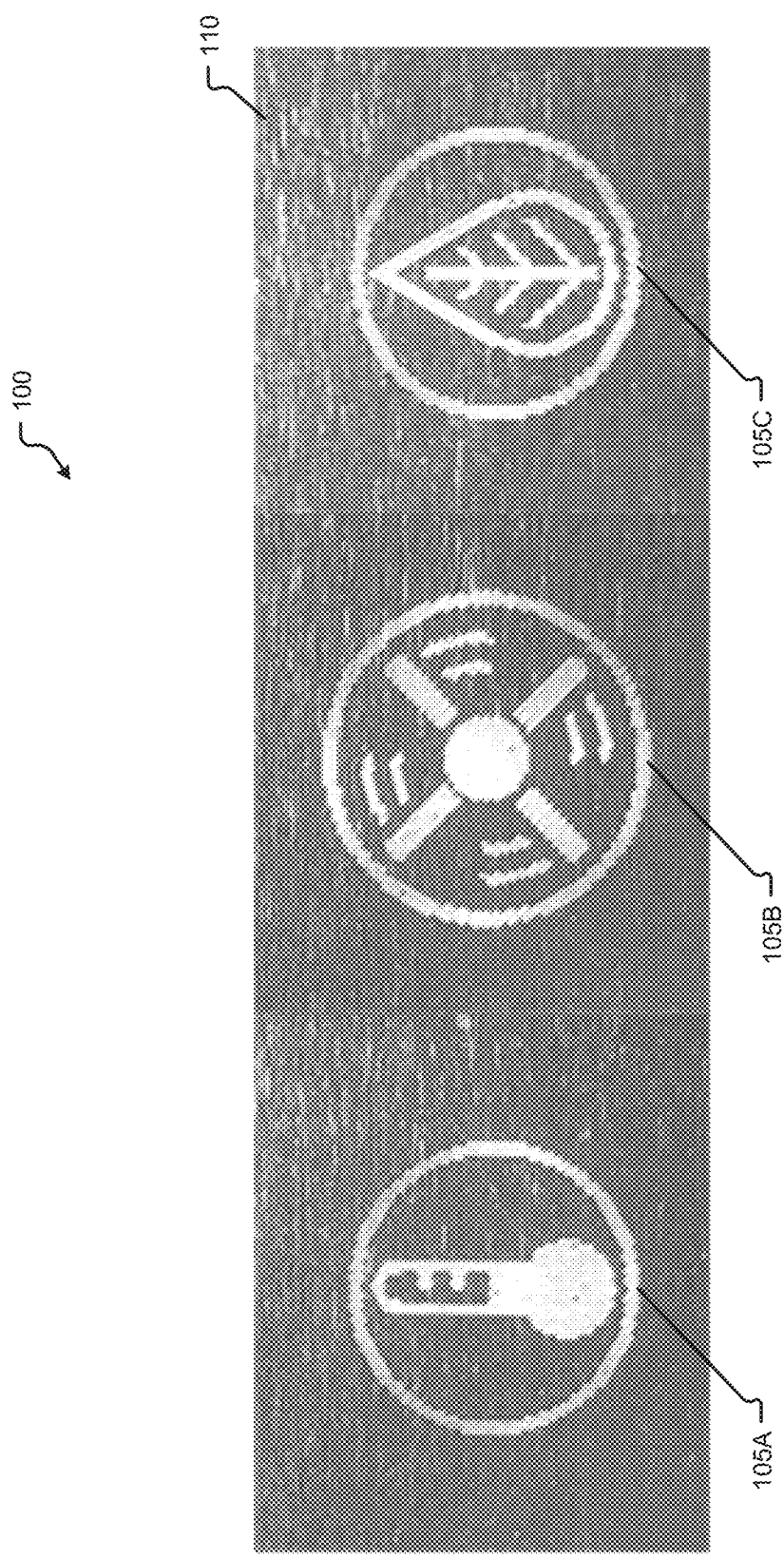
FIG. 1 is a diagram illustrating an exemplary panel of indicators on a touch sensitive metallic surface according to one embodiment of the present disclosure.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

In the following description, for the purposes of explanation, numerous specific details are set forth in order to provide a thorough understanding of various embodiments disclosed herein. It will be apparent, however, to one skilled in the art that various embodiments of the present disclosure may be practiced without some of these specific details. The ensuing description provides exemplary embodiments only and is not intended to limit the scope or applicability of the disclosure. Furthermore, to avoid unnecessarily obscuring the present disclosure, the preceding description omits a number of known structures and devices. This omission is not to be construed as a limitation of the scopes of the claims. Rather, the ensuing description of the exemplary embodiments will provide those skilled in the art with an enabling description for implementing an exemplary embodiment. It should however be appreciated that the present disclosure may be practiced in a variety of ways beyond the specific detail set forth herein.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

Various additional details of embodiments of the present disclosure will be described below with reference to the figures. While the flowcharts will be discussed and illustrated in relation to a particular sequence of events, it should be appreciated that changes, additions, and omissions to this sequence can occur without materially affecting the operation of the disclosed embodiments, configuration, and aspects.

Embodiments of the present disclosure are directed to a detailed lit indicator and touch detection in the same location through a metal surface. When the light behind the metal is turned off there will be no visible appearance of an indicator. When touched the metal will have no perceptible movement and never experience any deformation or evidence of usage over the life of the product.

FIG. 1 is a diagram illustrating an exemplary panel of indicators on a touch sensitive metallic surface according to one embodiment of the present disclosure. More specifically, this example illustrates a panel 100 of indicators. According to one embodiment, the surface 110 of the panel 100 can be metallic. In other cases, other materials may be used including, but not limited to, various types of plastics. The surface 110 of the panel can have small holes drilled therein. These holes can be arranged to form various icons 105A-105C. As will be described further below, a light can be positioned behind each icon 105A-105C to illuminate the icons 105A-105C individually. In some cases, the holes in the surface 110 of the panel 100 can be small enough, perhaps microscope, to be invisible to the unaided human eye from normal viewing range for the location in which the panel 100 is installed, e.g., on a dashboard of a vehicle, on a control panel of an appliance or consumer electronic device, etc. Also as will be described further below, the panel 100 can be touch-sensitive at the location of each icon 105A-105C. According to one embodiment, a touch at each icon 105A-105C location on the surface 110 of the panel 100 can be detected without perceivable movement or deformation of the surface 110 of the panel 100.

Figure 2:
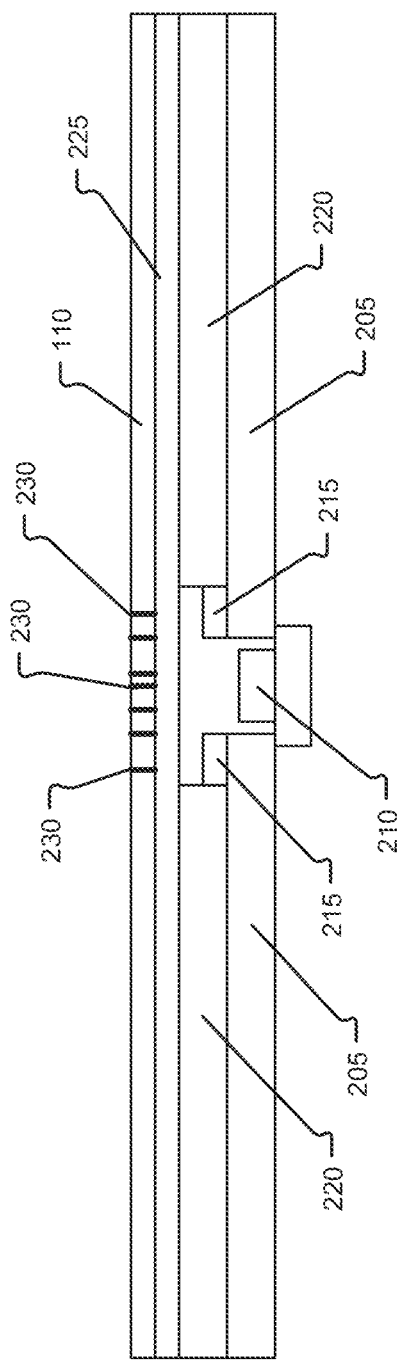
FIG. 2 is a diagram illustrating a cross-sectional side view of a touch-sensitive input device according to one embodiment of the present disclosure.

FIG. 2 is a diagram illustrating a cross-sectional side view of a touch-sensitive input device according to one embodiment of the present disclosure. As illustrated in this example, the touch-sensitive input device 200 which may be part of the panel 100 described above can include a base layer 205, a light source 210, a sensor, a spacer layer 220, a diffusion layer 225 and a surface layer 110 having a set of holes 230. To provide detailed and evenly lit icon indicators the light source 210 be distanced from the metal surface layer 110. The light diffusion layer 225 on the underside of the metal surface layer 110 can also help to more evenly spread the light from the light source 210 shining on and through the holes 230 in the surface layer 110. An exemplary distance for the separation of the light source 210 and the metal surface layer 110 can be approximately 1.5 mm.

According to one embodiment, the base layer 205 can be a Printed Circuit Board (PCB) and the light source 210 can be a reverse mount Light Emitting Diode (LED) attached to the PCB on the side away from the metal surface layer 110. The PCB can have one or more holes in it for mounting LEDs which can shine through the holes and towards the metal surface layer 110.

To provide detection of the user touching the metal surface layer 110 in a particular location, i.e., over an icon presented by the light from the light source 210 shining through the holes 230 of the surface layer 110, a sensor 215 may be placed under the surface layer 110. The metal of the surface layer 110 will very slightly bend downward against the pressure of the touch and if the metal is reinforced around the areas of detection, then the metal will only bend directly under the press point. This movement will not be perceivable to the user and will not damage the metal surface in any way even after extended use.

To detect the slight bending of the metal surface a capacitance sensor can be used to essentially measure the distance between the metal surface layer 110 and the capacitance sensor directly below. By detecting that the distance has become less during the touch, the input device 200 can detect when the user has touched the metal surface layer 110 in that location. This method of touch detection can use a distance from the capacitance sensor to the metal surface layer 110 of between 0.1 mm and 0.3 mm.

Alternatively, the sensor 215 can comprise a conductor just below the metal surface layer 110. When the metal bends slightly downward it can contact the signal conductor and short the conductor to ground which can be used as an input. This method of touch detection can use a distance from the sensor 215 to the metal surface layer 110 of 0.1 mm or less to ensure reliable contact between the sensor surface and the metal surface.

In order to have the touch detection circuit not interfere with the light source for the icon, the sensor 215 can be positioned around the light source 210 but remain very close to the icon on the surface layer 110. In order to keep the sensor 215 close to the surface layer 110 to detect touch and keep the light source 210 away from the surface layer 110 to provide diffuse LED illumination of the icon, the surface of the sensor 215 can be positioned relatively high above the surface of the base layer 205. The surface of the sensor 215 can be a ring that can be connected to either the capacitance sensor or the conductor that detects a short to the top metal surface. The light for the icon can shine inside this ring and through the small holes in the metal surface layer 110. A diffusion layer 225 of diffusing material can be located inside the sensor ring and/or between the spacer layer 220 and surface layer 110 to evenly disperse the light.

Stated another way, a touch-sensitive input device 200 can comprise a planar base layer 205 having a hole disposed therein. For example, the base layer 205 can comprise a PCB. A light source 210 can be mounted on a first side of the base layer 205 and can extend into the hole in the base layer 205. The light source 210 can comprise, for example, an LED.

A metallic surface layer 110 can be disposed over the base layer 205 on a second side of the base layer 205 opposite the first side of the base layer 205. The metallic surface layer 110 can comprise a plurality of holes 230 forming an indicator on the surface layer 110. For example, the indicator can be icon formed from the plurality of holes 230 in the surface layer 110. The indicator can be visible on a side of the surface layer 110 opposite the base layer 205 when the light source 210 is on and not visible on the side of the surface layer 110 opposite the base layer 205 when the light 210 source is off. In some cases, a diffusion layer 225 can be disposed between the spacer and the surface layer 220.

A sensor 215 can be disposed between the base layer 205 and the surface layer 110 adjacent to the light source 210 without covering the light source 210. A spacer layer 220 can be disposed between the base layer 205 and the surface layer 110. The spacer layer 220 can surround the sensor 215 and the hole in the base layer 205 without covering the light source 210 and can maintain a distance between the base layer 205 and the surface layer 110 and a distance between the surface layer 110 and the sensor 215. For example, the sensor 215 can comprise a capacitive sensor. In such cases, the distance between the surface layer 110 and the capacitive sensor can be in the range of 0.1 millimeters to 0.3 millimeters. In another example, the sensor 210 can comprise a conductor. In such cases, the distance between the surface layer 110 and the conductor can be approximately 0.1 millimeters. The overall distance between the base layer 205 and the surface layer 110 maintained by the spacer layer 220 can be, for example, between 1.2 millimeters and 1.5 millimeters.

Figure 3:
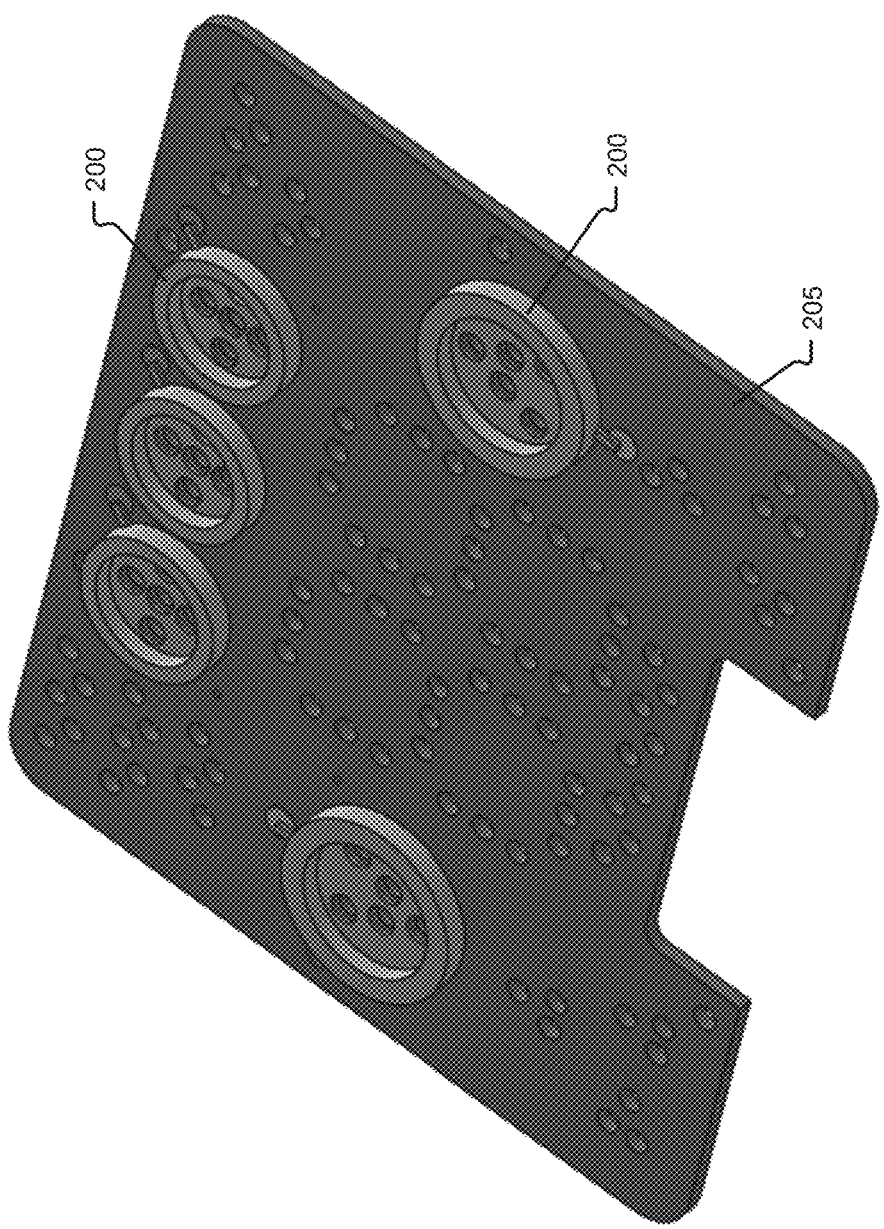
FIG. 3 is an isometric view of a Printed Circuit Board (PCB) according to one embodiment of the present disclosure.

FIG. 3 is an isometric view of a Printed Circuit Board (PCB) according to one embodiment of the present disclosure. As noted above, a number of touch-sensitive input devices 200 as described herein can be mounted together on a PCB to for a panel 100. This example illustrates one such arrangement. More specifically, this example illustrates a panel 100 with the surface layer 110 removed to reveal a PCB base layer 205 with a plurality of touch-sensitive input devices 200 as described above mounted thereon. It should be noted that any number of the touch-sensitive input devices 200 in any of a variety of sizes and arrangements may be used. As noted, such devices may be used, or example, as panels on a dashboard or console of an automobile or as a control panel for any of a wide variety of electronic devices.

The present disclosure, in various aspects, embodiments, and/or configurations, includes components, methods, processes, systems, and/or apparatus substantially as depicted and described herein, including various aspects, embodiments, configurations embodiments, sub-combinations, and/ or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A touch-sensitive input device comprising:
    a planar base layer having a hole disposed therein;
    a light source mounted on a first side of the base layer and extending into the hole in the base layer;
    a metallic surface layer disposed over the base layer on a second side of the base layer opposite the first side of the base layer and forming an exterior, touch surface of the touch-sensitive input device, wherein the metallic surface layer comprises a plurality of holes directly over the light source and forming an indicator on the metallic surface layer, wherein the plurality of holes and the indicator formed by the plurality of holes are not visible to an unaided human eye when the light source is off and wherein the indicator formed by the plurality of holes only becomes visible to an unaided human eye when the light source is on;
    a sensor disposed between the base layer and the metallic surface layer adjacent to the light source without covering the light source;
    a spacer layer disposed between the base layer and the metallic surface layer, the spacer layer comprising a ring surrounding the sensor, the hole in the base layer, and the light source without covering the light source and wherein the spacer layer maintains a distance between the base layer and the metallic surface layer and a distance between the metallic surface layer and the sensor; and a diffusion layer disposed within the ring of the spacer layer between the spacer and the metallic surface layer, wherein the diffusion layer diffuses light emitted by the light source.

2. The touch-sensitive input device of claim 1, wherein the indicator is an icon formed from the plurality of holes in the metallic surface layer.

3. The touch-sensitive input device of claim 1, wherein the light source is a Light Emitting Diode (LED).

4. The touch-sensitive input device of claim 1, wherein the sensor comprises a capacitive sensor.

5. The touch-sensitive input device of claim 4, wherein the distance between the metallic surface layer and the capacitive sensor is from 0.1 millimeters to 0.3 millimeters.

6. The touch-sensitive input device of claim 1, wherein the sensor comprises a conductor.

7. The touch-sensitive input device of claim 6, wherein the distance between the metallic surface layer and the conductor is 0.1 millimeters.

8. The touch-sensitive input device of claim 1, wherein the base layer comprises a Printed Circuit Board (PCB).

9. The touch-sensitive input device of claim 1, wherein the distance between the base layer and the metallic surface layer maintained by the spacer layer is between 1.2 millimeters and 1.5 millimeters.

10. A Printed Circuit Board (PCB) comprising:
a plurality of holes disposed in a surface of the PCB; and
a plurality of touch-sensitive input devices mounted on the PCB, each touch-sensitive input device of the plurality of touch-sensitive input devices comprising:
a light source mounted on a first side of the PCB and extending into a hole of the plurality of holes in the PCB;
a metallic surface layer disposed over the PCB on a second side of the PCB opposite the first side of the PCB and forming an exterior, touch surface of the plurality of touch-sensitive input devices, wherein the metallic surface layer comprises a plurality of holes directly over the light source and forming an indicator on the metallic surface layer, wherein the plurality of holes and the indicator formed by the plurality of holes are not visible to an unaided human eye when the light source is off and wherein the indicator formed by the plurality of holes only becomes visible to an unaided human eye when the light source is on;
a sensor disposed between the PCB and the metallic surface layer adjacent to the light source without covering the light source;
a spacer layer disposed between the PCB and the metallic surface layer, the spacer layer comprising a ring surrounding the sensor the hole in the PCB, and the light source without covering the light source and wherein the spacer layer maintains a distance between the PCB and the metallic surface layer and a distance between the metallic surface layer and the sensor; and
a diffusion layer disposed within the ring of the spacer layer between the spacer and the metallic surface layer, wherein the diffusion layer diffuses light emitted by the light source.

11. The PCB of claim 10, wherein the indicator is an icon formed from a plurality of holes in the metallic surface layer.

12. The PCB of claim 10, wherein the light source is a Light Emitting Diode (LED).

13. The PCB of claim 10, wherein the sensor comprises a capacitive sensor.

14. The PCB of claim 10, wherein the sensor comprises a conductor.

* * * * *